(12) United States Patent
Kussyk et al.

(10) Patent No.: US 9,482,709 B2
(45) Date of Patent: Nov. 1, 2016

(54) METHOD AND DEVICE FOR ASSIGNING INDIVIDUAL PHASE CONDUCTORS IN A POLYPHASE ENERGY DISTRIBUTION NETWORK

(75) Inventors: Jaroslaw Kussyk, Vienna (AT); Johann Lichtnekert, Vienna (AT); Richard Pitz, Vienna (AT); Wolfgang Salmutter, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 165 days.

(21) Appl. No.: 14/402,344

(22) PCT Filed: May 22, 2012

(86) PCT No.: PCT/EP2012/059421
§ 371 (c)(1),
(2), (4) Date: Nov. 20, 2014

(87) PCT Pub. No.: WO2013/174415
PCT Pub. Date: Nov. 28, 2013

(65) Prior Publication Data
US 2015/0091545 A1    Apr. 2, 2015

(51) Int. Cl.
*G01R 31/02* (2006.01)
*G01R 29/18* (2006.01)
(Continued)

(52) U.S. Cl.
CPC ............. *G01R 29/18* (2013.01); *G01R 31/02* (2013.01); *H02J 13/0055* (2013.01); *H02J 3/26* (2013.01); *Y02E 40/50* (2013.01)

(58) Field of Classification Search
CPC ...... G01R 29/16; G01R 29/18; G01R 31/02; G01R 31/021; G01R 31/023; G01R 31/041; G01R 31/2813; G01R 11/40; G01R 21/06; G01R 19/00; G01R 19/0084; G01R 19/0092; H02J 3/26; Y02E 40/50; H01H 71/7445; H02H 3/302; H02H 3/353; H02H 3/382
USPC .......... 324/66, 76.11, 76.52, 76.77, 86, 107; 361/85, 86, 87
See application file for complete search history.

(56) References Cited

U.S. PATENT DOCUMENTS 3,963,964 A * 6/1976 Mustaphi ............... H02H 3/307
361/64
4,626,622 A    12/1986 Bouvrette
(Continued)

FOREIGN PATENT DOCUMENTS

EP    0146425 A1    6/1985
EP    2388600 A1    11/2011
(Continued)

*Primary Examiner* — Hoai-An D Nguyen
(74) *Attorney, Agent, or Firm* — Laurence Greenberg; Werner Stemer; Ralph Locher

(57) ABSTRACT

A method for assigning individual phase conductors at a first point to those at at least one further point in a polyphase energy distribution network, in particular in a three-phase network. In the case of mains operation, wherein a common reference time is determined for these points, and the time difference and/or phase difference of the phase voltage or the line-to-line voltage between the reference time of a zero crossing of the phase voltage are determined for these points. By a comparison of the time and/or phase differences at two different points the phase conductor of one point is assigned to a phase conductor of the further point which has the same to time and/or phase difference with respect to the common reference time. An additional loading of the energy supply network or an interruption of the mains operation is avoided by the method.

17 Claims, 4 Drawing Sheets

(51) Int. Cl.
*H02J 13/00* (2006.01)
*H02J 3/26* (2006.01)

(56) References Cited

U.S. PATENT DOCUMENTS

| | | | |
|---|---|---|---|
| 5,510,700 | A | 4/1996 | Pomatto |
| 5,521,491 | A | 5/1996 | Najam |
| 7,598,720 | B2 | 10/2009 | Veroni et al. |
| 8,300,369 | B2 * | 10/2012 | Hamer .................. H02H 7/263 361/44 |

| | | | |
|---|---|---|---|
| 2003/0184275 | A1 | 10/2003 | Slade et al. |
| 2004/0251921 | A1 | 12/2004 | Bystrom et al. |
| 2010/0262395 | A1 | 10/2010 | Sharma et al. |
| 2011/0285382 | A1 | 11/2011 | Kolwalkar et al. |

FOREIGN PATENT DOCUMENTS

| | | |
|---|---|---|
| WO | 9506260 A1 | 3/1995 |
| WO | 2006018031 A1 | 2/2006 |

* cited by examiner

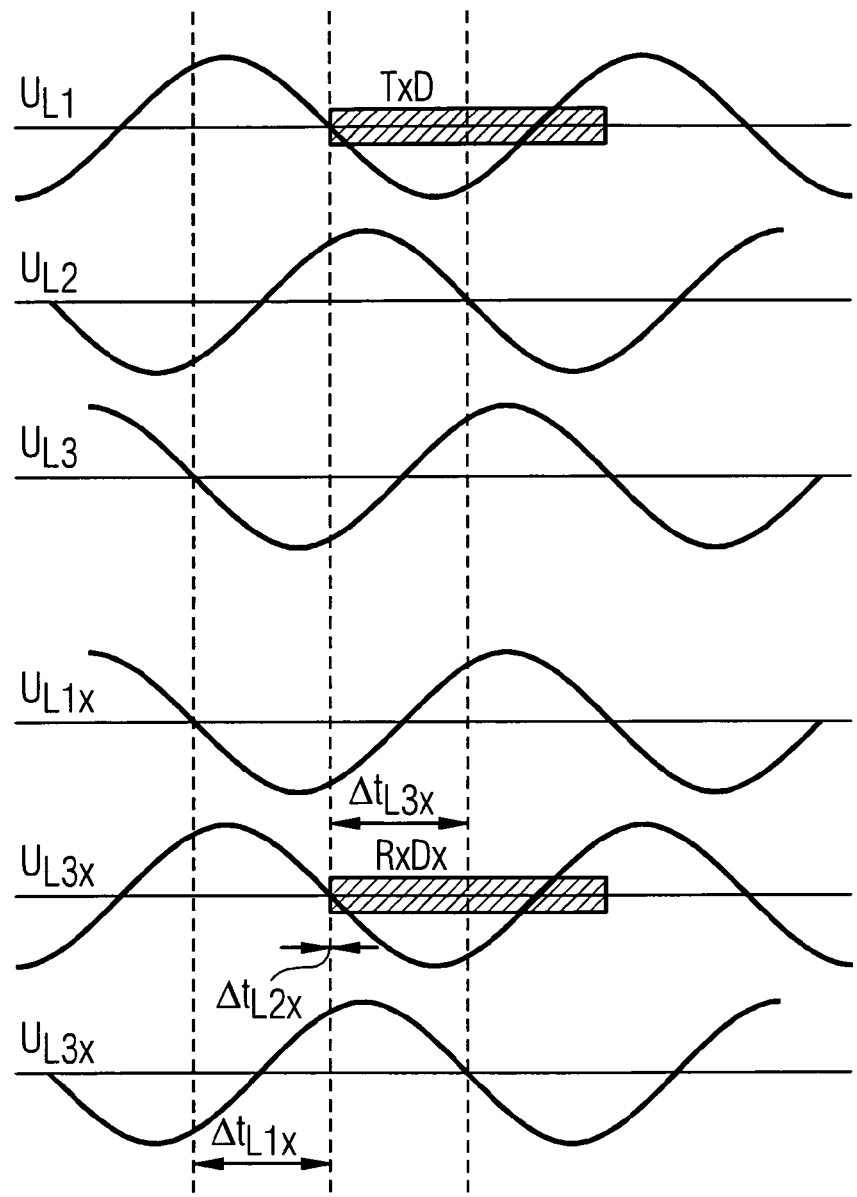

METHOD AND DEVICE FOR ASSIGNING INDIVIDUAL PHASE CONDUCTORS IN A POLYPHASE ENERGY DISTRIBUTION NETWORK

BACKGROUND OF THE INVENTION

1. Field of the Invention

The invention relates to a method for assigning individual phase conductors at one point to those at at least one further point in a polyphase energy distribution network, in particular in a three-phase network, in the case of mains operation, and to a corresponding device. Such a point can be located at any given point in the energy distribution network, however in any event the main connection points of consumers and also the distribution stations, such as transformer stations, mains distribution cabinets and the like are of interest.

2. Prior Art

Systems with three or four conductors are often used for three-phase alternating current transmission in electrical energy distribution networks, in particular in medium-voltage or low-voltage networks. When said networks are put into operation or expanded, attention is often only paid to a uniform phase sequence at the three-phase terminals of the households, for example to a sequence of the phase differences rising or falling by consecutive 120° cycles in a system with four conductors or between the line-to-line voltages in a system with three conductors.

The result of this practice is that an assignment between the individual phase conductors of a distribution station, such as a transformer station, and the phase conductors at the consumers is not known. In other words it is not known which phase conductor at the consumer corresponds to which phase conductor in the distribution station.

With the increasing decentralization of energy generation, by private photovoltaic systems or small combined heat and power systems in private households for example, the usage of the electric energy distribution networks is also changing: from a central power distribution—from one or more transformer stations to the consumer—to an at least at times decentralized power distribution—such as from one household to other households or from a number of private energy generators to the transformer station or into the medium-voltage network.

In order to be able to guarantee the monitoring and control of the voltage quality as well as the monitoring of the power distribution in such decentralized energy distribution networks, a unique assignment of one or more phase conductors at a consumer terminal to a specific phase conductor of a phase of the energy distribution network is required, also in the event of a change in the structure of the energy distribution network.

Employing network expansion plans or installation plans for this purpose is often not sufficient since said plans are incomplete or cannot correspond to the actual energy distribution network.

In accordance with DE 196 21 543 A1 it is known that a load can be connected for a defined period of time with a specific size to a network phase of the energy supply network and, on the basis of this upwards or downwards change in the load, the connected phase in the network can be identified. This has the disadvantage that, not only does an additional device have to be provided for this purpose but that this imposes a load on the energy supply network. With this method only one network phase can ever be checked and assigned.

EP 0 961 125 A2 proposes carrying out the phase identification of medium-voltage cables in a state short-circuited to ground, and doing this by injecting a tone frequency into the line to be identified. The disadvantage of this is that operation of the network must be interrupted to perform the identification. With this method too only one network phase after the other can ever be checked and assigned.

BRIEF SUMMARY OF THE INVENTION

An object of the present invention is to provide a method and a device which at least overcomes the disadvantages of the additional load imposed on the energy supply network and the interruption of network operation.

This object is achieved for a method and for a device with the features of the independent claims. Advantageous embodiments of the invention are defined in the respective dependent claims.

In accordance with the invention there is therefore provision, in the method for assigning individual phase conductors at one point to those at at least one further point in a polyphase energy distribution network, in particular in a three-phase network, in the case of mains operation, that a common reference point is determined for these points, for the first point in the case of a four-conductor network, the time difference and/or phase difference of the phase voltage between the reference time and the time of the zero crossing of the phase voltage is determined for at least one phase conductor or in the case of a three-conductor network the time difference and/or phase difference of the line-to-line voltage between the reference time and the time of the zero crossing of the line-to-line voltages is determined for at least two phase conductors, for the further point, in the case of a four-conductor network, the time difference and/or phase difference of the phase voltage between the reference time and the time of the zero crossing of the phase voltage is determined for at least one phase conductor, or in the case of a three-conductor network, the time difference and/or the phase difference of the line-to-line voltages between the reference time and the time of the zero crossing of the line-to-line voltages is determined for a least two phase conductors, and, by comparing the time and/or phase differences at the first point with those at the further point, that phase conductor of the first point is assigned to a phase conductor of the further point having the same time and/or phase difference in relation to the common reference time.

An inventive point is a defined location in a polyphase energy distribution network where the phase voltages of a least one phase conductor are determined, i.e. measured. In order to establish for example the phase conductor to which a specific consumer, such as a household is connected, a point in or at a transformer station and a further point at the consumer can be provided. If a voltage measuring device is present in any event at a point, such as in a transformer station, at a current meter with remote readout, distribution network monitoring or a system for measuring the voltage quality, it makes sense to employ this voltage measurement device as the monitoring point.

The term "common reference time" means that the determination, for example the measurement, of the phase voltage takes place simultaneously or synchronously at at least two points. If more than two points are employed for a measurement it must be ensured here too that the measurement takes place simultaneously at all points. If the measurement is triggered by means of a signal the propagation time of the signal to the individual points is therefore to be taken into consideration in the determination of the common reference time. If the propagation time of the signal is negligible in relation to the phase duration of the alternating current of the energy distribution network then propagation time correction of the signal does not have to be undertaken and the receive time of the signal is employed as the common reference time.

Since each full phase (360°) of the phase voltage or of the line-to-line voltage has two zero crossings, the "zero crossing of the phase voltage" either always only means the crossing at the falling edge or always only means the crossing at the rising edge. During the measurement of the phase voltage or of the line-to-line voltage said voltage must be filtered if necessary so that harmonics are eliminated and the zero crossing of the fundamental wave can be established.

During comparison of the time and/or phase differences at two different points, where the phase conductor of the one point is assigned to a phase conductor of the further point which has the same time and/or phase difference in relation to the common reference time, it is to be taken into account that the "same time and/or phase difference" can only be fulfilled in the ideal case. As a rule, as a result of measurement imprecisions or actual reference times deviating slightly from one another at different points, the time and/or phase differences of a phase conductor can differ slightly (as a rule by up to 5%) from one another. "Same time and/or phase difference" thus means here that those time and/or phase differences are assigned to one another which have the smallest deviation or scatter in relation to one another.

The phase information, i.e. the phase difference (which is also referred to as phase offset) is dependent on the connection type (phase voltage or line-to-line voltage in a 4-conductor and/or 3-conductor system). Of course the terms "time difference" and "phase difference" describe the same physical state and are therefore able to be used synonymously within the context of the invention.

Through the inventive method, on the one hand no additional load is used and on the other hand mains operation does not have to be interrupted but just the current phase voltage is needed in each case for the inventive method.

As a rule there is provision in the inventive method for the phase voltages or line-to-line voltages of all (three) phase conductors to be determined for each point at the reference time. This enables all phase conductors to be assigned to one another uniquely at the different points—as a result of a single measurement process. Thus a number of consecutive measurements do not have to be carried out on the individual phase conductors, such as is provided for as a result of DE 196 21 543 A1. However the method can also be applied to just one or two phase conductors: To do this, when the phase voltages are measured, at one point at least the phase voltage of one phase conductor and at a further point at least the phase voltage of one phase conductor is determined. The phase voltage is always measured between the phase conductor and the neutral conductor. When the line-to-line voltages are measured at least one line-to-line voltage is measured (between two phase conductors) at one point and at least one line-to-line voltage is measured at a further point.

An embodiment variant of the invention makes provision for the common reference time to be selected so that this time coincides with the time of the zero crossing of a phase voltage or of a line-to-line voltage at the first point. This corresponds to the method in FIG. 3: Since the reference time coincides with a zero crossing, a measurement of the phase voltage or of the line-to-line voltage can be dispensed with.

Independently of the said embodiment variants, the common reference time can be determined in a simple manner by sending out a signal to the points. If the points are at different distances from the point of origin of the signal, the propagation time of the signal may also have to be taken into consideration in the determination of the common reference time. If the propagation time of the signal is to be ignored by comparison with the phase duration of the phase voltages, this will not be necessary.

For data transmission systems with a number of transmission sections (hops, repeats), when the signal is received in the form of a data packet, the secure receipt at all hop levels or all repeats can be awaited and only then the phase location of the phase voltages be evaluated synchronously. This means that possible frequency fluctuations of the network frequency during the transmission cannot adversely affect the measurement accuracy as a result of the number of hops or the number of repeats.

In particular in this case there can be provision for the time of the receipt of the signal—at the respective measurement point—to be the common reference time.

But it is also possible for the signal to contain information which defines the reference time for a time after the receipt of the signal. Thus the signal can contain information about whether the measurement is to be carried out at a specific point in time in the future, and this point in time will be read out on a local clock. In addition the signal can also contain information for synchronizing a local clock at one point with those at other points, so that the measurement of the phase voltages then actually takes place at the same time at all measurement points involved on the basis of the respective local clocks.

It would also be possible to define the common reference time by a number of signals sent out one after the other.

Basically there are different options for how the signal will be transmitted to the individual points.

One option consists of the signal being transmitted over one or more conductors (phase conductor, neutral conductor). The energy distribution network can thus advantageously be used for transmitting the signal. The signal can especially be generated for this purpose at one point and sent out from this point and then transmitted. This has the advantage that the signal generator in the devices necessary for carrying out the method can be integrated at one of the points. This additionally enables data from this point, such as phase positions of the phase voltages absolute and relative to one another, specifications about a (repeating) transmission time, a temporal reference of the transmit time to the instantaneous phase of at least one phase conductor etc., to also be transmitted as well to other points with this signal.

The signal can however also be transmitted via another wired or wireless transmission medium, such as via radio.

There can however also be provision for the signal generator to be located in a different location rather than at one location.

The signal can, in particular when it is sent out from a point in the polyphase energy transmission network, also contain information about the time or phase differences of the phase voltages or line-to-line voltages at one point, especially at the point in accordance with claim 3.

The inventive device for carrying out the inventive method is characterized in that a signal generator is provided for defining the common reference time, a phase measurement unit is provided at at least two points, with which the time of the zero crossing of the phase voltage on at least one phase conductor or the line-to-line voltage of at least two phase conductors can be measured, a comparison unit connected to at least one phase measurement unit is provided at these points, wherein the time difference or the phase difference between reference time and time of the zero crossing can be determined with the phase measurement unit, and at least one assignment unit connected to the comparison unit or units is provided, with which, by comparing the time or phase differences at two different points, that phase conductor of the first point can be assigned to a phase conductor of the second point which has the same time or phase difference.

An alternate device makes provision for a signal generator, for defining the common reference time at the time of zero crossing of the phase voltage or of a line-to-line voltage, to be provided at a first point, a phase measurement unit to be provided at the first point or at at least one further point, with which the time of the zero crossing of the phase voltage on at least one phase conductor or the line-to-line voltage of at least two phase conductors can be measured, a comparison unit connected to the phase measurement unit to be provided at the second point, wherein the time difference or the phase difference between reference time and time of the zero crossing can be defined with the phase measurement unit, and that phase conductor of the first point can be assigned to a phase conductor of the second point with the comparison unit, an assignment unit to be provided at a point, especially the first point, with which the information about the assignment can be collected and further distributed.

The device for defining the common reference time can comprise a transceiver unit at each point and a signal generator, in particular at one point.

For transmission of signals, especially of data packets, at least one transceiver unit can be disposed at each point, which is connected to the phase measurement unit and if necessary to the signal generator, the comparison unit and the assignment unit, for transmission of signals, especially of data packets.

For transmission of signals, especially of data packets via the energy distribution networks, there can be provision for the transceiver unit to be connected to the phase conductors and the neutral conductor at each point. As an alternative there can be provision for the transceiver unit, for transmission of signals by means of conductors which do not belong to the energy distribution network, to be embodied at each point by means of radio or by means of optical transmission.

BRIEF DESCRIPTION OF THE SEVERAL VIEWS OF THE DRAWING

For further explanation of the invention reference is made in the subsequent part of the description to the figures, from which further advantageous embodiments, details and developments of the invention are to be taken. In the figures:

FIG. 4 shows the timing curves of the phase voltages of the phase conductors from FIG. 3.

DESCRIPTION OF THE INVENTION

Figure 1:
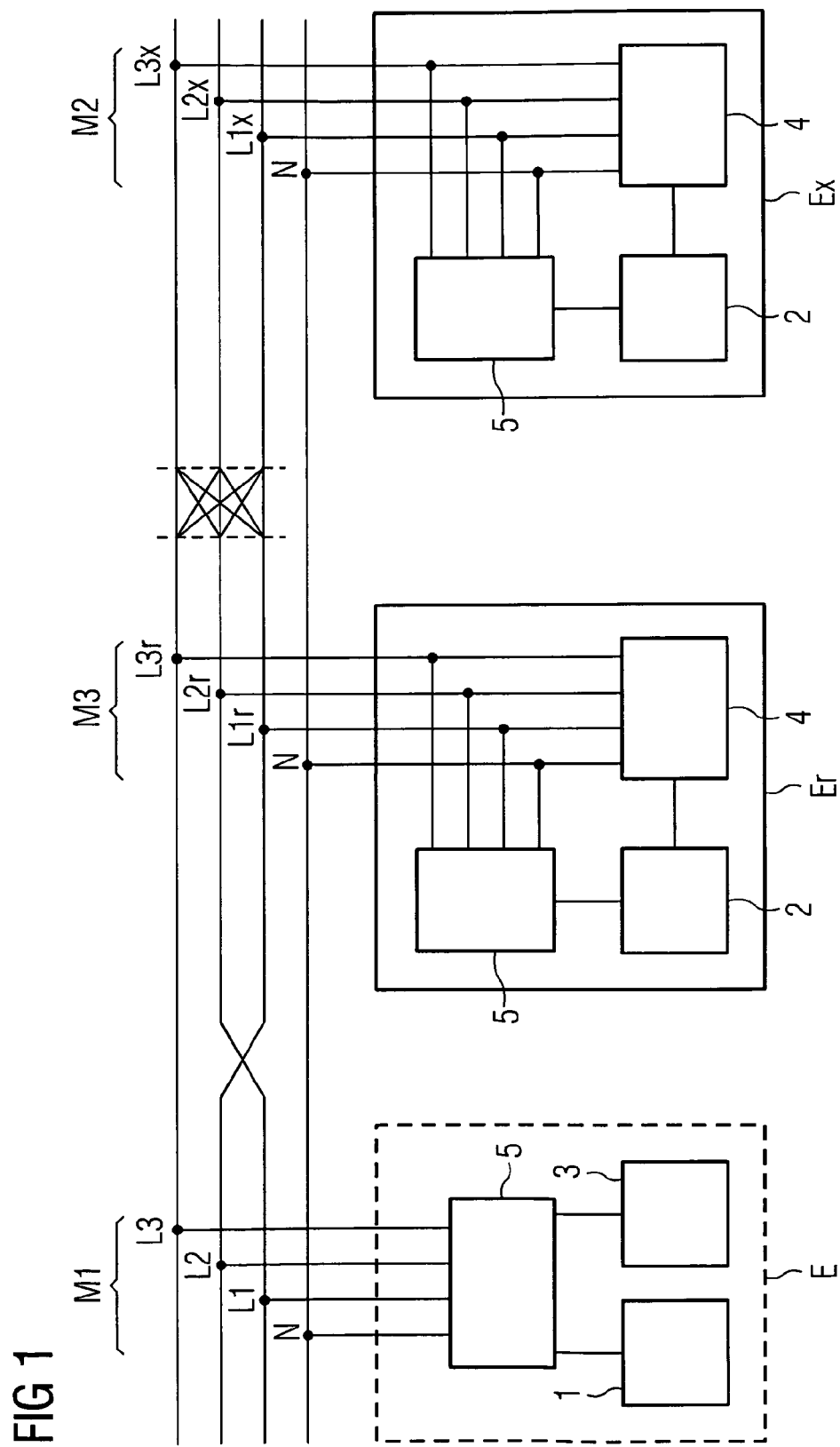
FIG. 1 shows a schematic diagram of an inventive device with a reference unit.

FIG. 1 shows a section from a three-phase network consisting of three phase conductors L1, L2, L3 and the neutral conductor N. At the first point M1 a first unit E is provided, at the second point M2 a second unit Ex. Between the first and second point, at a third point M3 a third unit, a so-called reference unit Er, is provided. The three phase conductors—first phase conductor L1, second phase conductor L2, third phase conductor L3—are located at the first point M1 in the diagram depicted in FIG. 1 in ascending order above one another, between first point M1 and third point M3 the phase conductors L1 and L2 are swapped, so that the first phase conductor L1$r$ at the third point M3 corresponds to the second phase conductor L2 at the first point M1, and the second phase conductor L2$r$ at the third point M3 corresponds to the first phase conductor L1 at the first point M1. Between the third point M3 and the second point M2 a point is shown in the drawing at which swapping of the phase conductors possibly also occurs, so that it is not known which phase conductor L1$x$, L2$x$, L3$x$ at the second point M2 (for example the connection location of a consumer) corresponds to which phase conductor at the first or third point M1, M3.

A signal generator 1 is provided in the first unit E at the first point M1, which creates a signal which is sent via a transceiver unit 5 to the other points M2, M3. The signal generator 1 also has a connection to the assignment unit 3 which is not shown here in FIG. 1. In this exemplary embodiment the transceiver unit 5 is a modem, namely a so-called DLC modem (distribution line carrier modem), which can transmit and receive data via one or more phase conductors of the three-phase network. This DLC modem usually uses a frequency range in this case of 3 to 95 kHz (up to 500 kHz would also be possible) with a data transmission rate of between less than 100 bit/s and multiples of 10 kbit/s.

A second unit Ex or a third unit (reference unit) Er are disposed at the second and third location M2, M3, which likewise each have a transceiver unit 5 available, embodied as a DLC modem. The transceiver units 5 are connected at each point M1, M2, M3 to the three phase conductors L1, L2, L3 and also to the neutral conductor N in each case.

Since in the present example the first point M1 takes over the assignment of the phase conductors, the transceiver units 5 here are also connected to the assignment unit 3, which likewise is disposed in the first unit E. The second and third point M2, M3 each have a phase measurement unit 4 in their units Ex, Er, which is connected to the three phase conductors L1, L2, L3 as well as to the neutral conductor N at the respective point, wherein the time of the zero crossing of the phase voltages in the three phase conductors L1, L2, L3 can be measured with the phase measurement unit 4. The second and third point M2, M3 additionally each have a comparison unit 2 connected to the phase measurement unit 4, with which, for the phase conductors, the time difference for the phase difference between reference time and time of the zero crossing of the phase voltage can be determined. The comparison unit 2 is connected in each case to the transceiver units 5 so that the time or phase differences determined can be transferred to the assignment unit 3, with which, by comparing the time or phase differences, the phase conductors of the different points can be assigned to one another.

Figure 2:
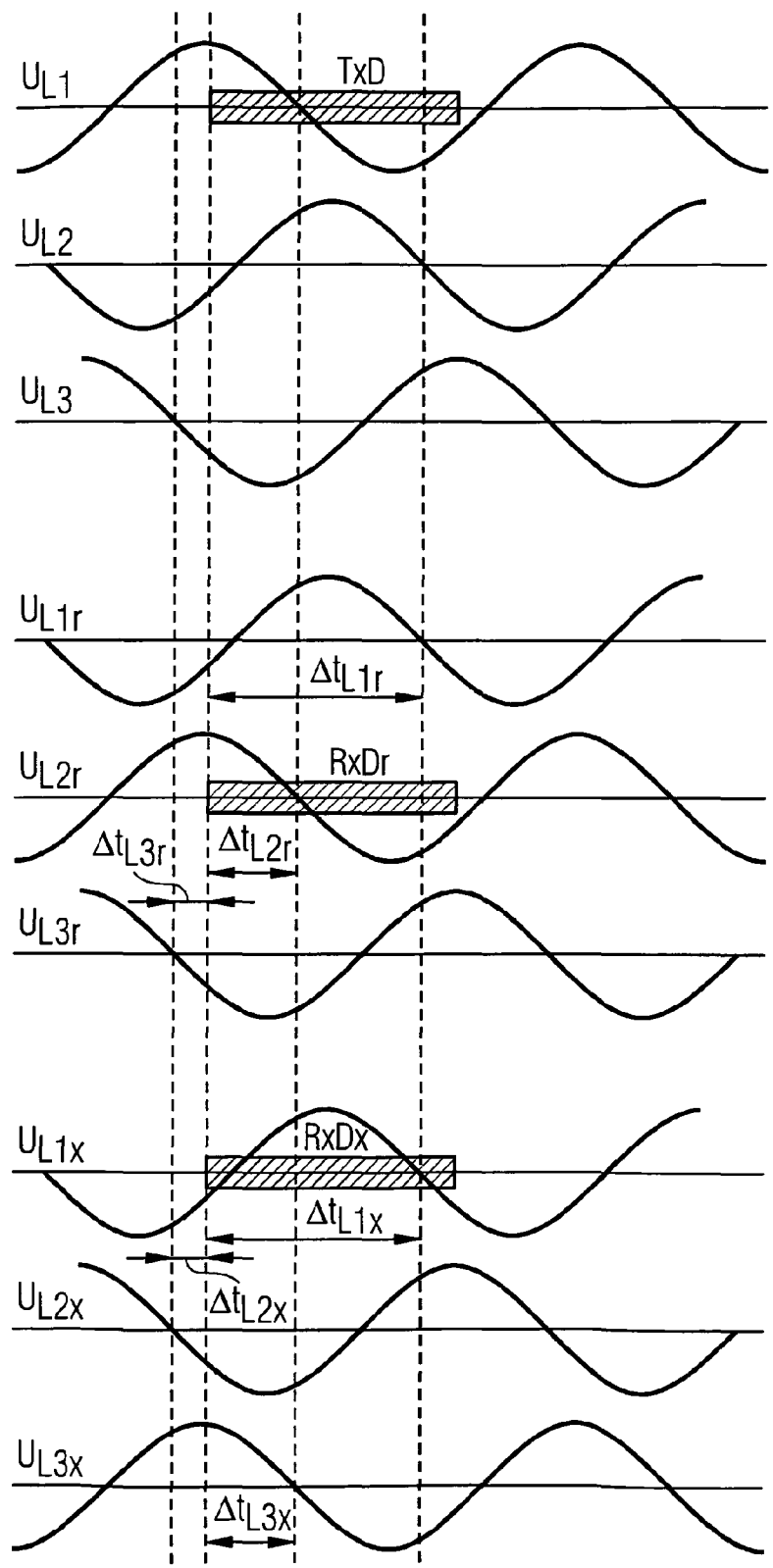
FIG. 2 shows the timing curves of the phase voltages of the phase conductors from FIG. 1.

FIG. 2 shows the timing curve of the phase voltages at the points M1, M2, M3 from FIG. 1 as well as the transmitted data packet TxD.

The signal generator 1 of the first unit E sends a data packet TxD at periodic intervals via the modem (transceiver unit 5) into the three-phase network, which is thus used as a communication medium between the units E, Er and Ex. In the second unit Ex the data packet is received as RxDx via the modem (transceiver unit 5), in the third unit Er via the modem (transceiver unit 5) as RxDr. Together with the additional information about the respective propagation time of the data packet, the data packet RxDx or RxDr is transferred to the respective comparison unit 2. In the phase measurement units 4 of the units Er, Ex as a result of the receipt of the data packet, the measurement of the phase information of the phase voltages of the individual phase conductors is initiated, the zero crossings of the phase voltages UL1$r$, UL2$r$, UL3$r$ or UL1$x$, UL2$x$, UL3$x$ are detected and transferred to the respective comparison unit 2 as phase information for comparison with the receive times of the data packets RxDx or RxDr. The receive time, corrected if necessary by the propagation time of the data packet RxDx or RxDr represents the reference time.

On comparison in the comparison units 2 of the units Er, Ex, time differences $\Delta tL1x$, $\Delta tL2x$, $\Delta tL3x$ or $\Delta tL1r$, $\Delta tL2r$, $\Delta tL3r$ between the receive times of the data packets RxDx or RxDr on the one hand and the times of the zero crossings of the corresponding phase voltages UL1$x$, UL2$x$, UL3$x$ or UL1$r$, UL2$r$, UL3$r$ on the other hand are formed. These time differences are shown in the drawing in FIG. 2.

The time differences $\Delta tL1x$, $\Delta tL2x$, $\Delta tL3x$, $\Delta tL1r$, $\Delta tL2r$, $\Delta tL3r$ are transferred, along with the associated connection designations or connection numberings of the phase conductors L1$x$, L2$x$, L3$x$, L1$r$, L2$r$, L3$r$ from the comparison units 2 via the modems (transceiver units 5) of the units Ex, Er to the assignment unit 3 in the units E. There individual time differences are classified on the basis of their values into three groups. Each group contains the approximately equal time differences:

Group 1: $\Delta tL2r$, $\Delta tL3x$
Group 2: $\Delta tL1r$, $\Delta tL1x$
Group 3: $\Delta tL3r$, $\Delta tL2x$ Since the assignment unit 3 has previously been notified of the assignment of the phase conductors L1$r$, L2$r$, L3$r$ at the third point M3 (corresponds to the third unit or reference unit Er) to that unit at the third point M1 (corresponds to the first unit E), in the assignment unit 3 the assignment of the phase conductors L1$x$, L2$x$, L3$x$ at the second point M2 (corresponds to the second unit Ex) can also be established and thus the mutual assignment of all phase conductors at all points M1, M2, M3 can be undertaken:
L1 corresponds to L2$r$ or L3$x$,
L2 corresponds to L1$r$ or L1$x$,
L3 corresponds to L3$r$ or L2$x$.

If necessary this information can also be transferred to the units Ex and Er, in particular their comparison units 2, possibly likewise via the phase conductors by means of the modems (transceiver units 5). The information can also be transferred to other devices and systems.

In general, in this form of embodiment, the information about the time differences and/or the instantaneous phases of the phase voltages of the individual phase conductors along with their unique numbers in the energy distribution network and possibly with further measurement values can be made available to all assignment units 3 via the same transmission system as is used for the data packet TxD or RxDx and RxDr (i.e. by means of DLC modems over the energy distribution network) or via an additional data transmission system, which units need information about the phase conductor assignment at the points (connection points) of the energy distribution network. The signal generator 1 can be integrated into the assignment unit 3. This enables all data, which it is to accept into the signal in the form of the data packet TxD, to be simply transmitted to the signal generator 1.

In the assignment unit 3 the time differences or the instantaneous phases are divided into groups with a scattering of the values which is as small as possible. Thus conductor connections at various locations (points) of the energy distribution network are assigned to a common phase conductor. This corresponds to a relative assignment. In order to subsequently undertake absolute assignment of the grouped connections, the only requirement is for at least one reference connection per group of time differences or phases of which the designation is known. In FIG. 1 the reference connections are located at the reference unit Er.

Figure 3:
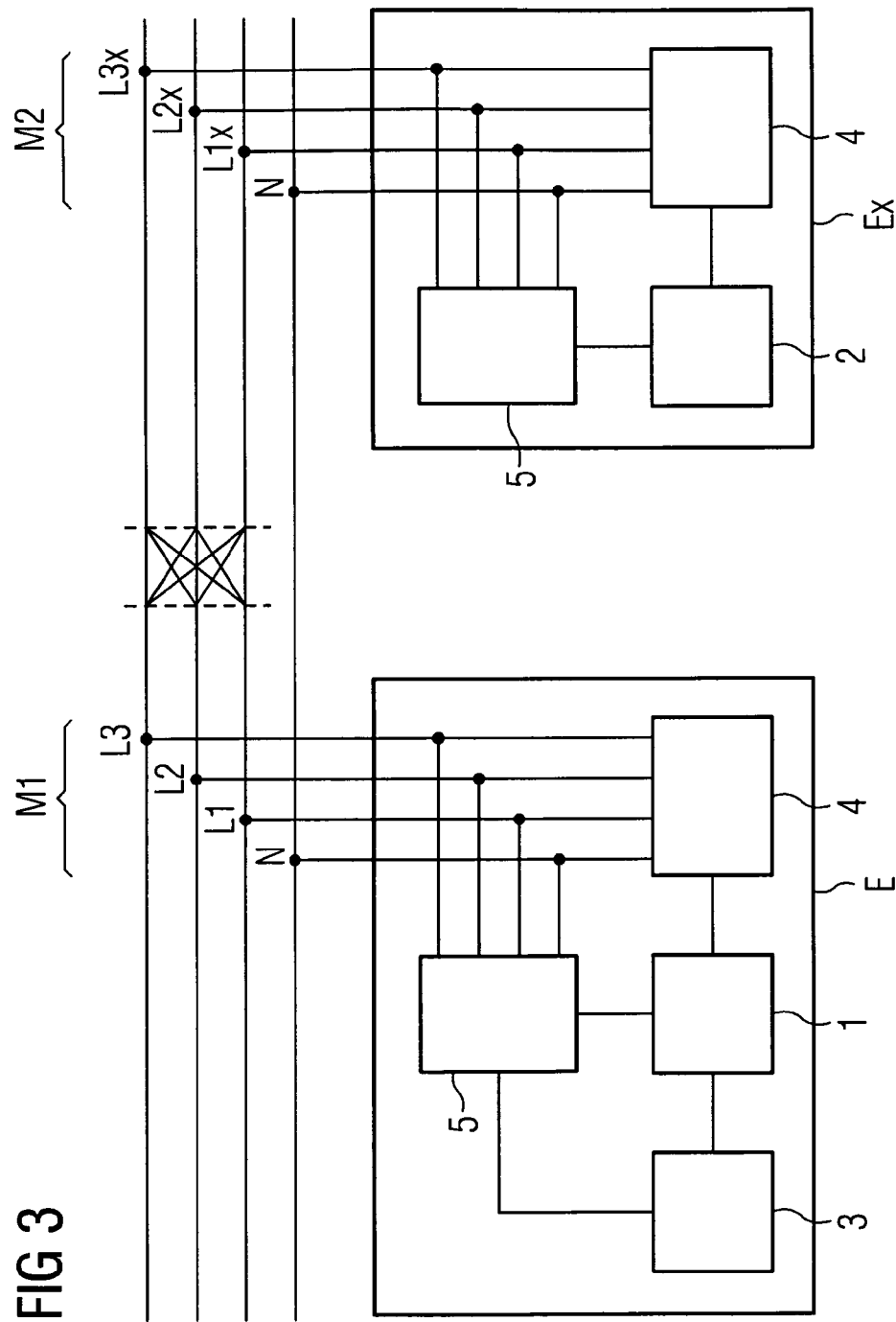
FIG. 3 shows a schematic diagram of an inventive device without reference unit

FIG. 3 shows a further exemplary embodiment, in which the inventive device makes do without the reference unit Er. The device essentially consists of the central first unit E and a second unit Ex. A number of units Ex can also be present.

The section of a three-phase network shown in FIG. 3 again consists of three phase conductors L1, L2, L3 and a neutral conductor N. At the first point M1 a first unit E is provided, at the second point M2 a second unit Ex is provided. The three phase conductors—first phase conductor L1, second phase conductor L2, third phase conductor L3—are located at the first point M1 in the diagram in FIG. 3 in ascending order above one another, between first point M1 and second point M3 a point is shown in the drawing at which possibly a swapping of the phase conductors takes place, so that it is not known which phase conductor L1$x$, L2$x$, L3$x$ at the second point M2 (such as the connection point of a consumer) corresponds to which phase conductor at the first point M1.

A signal generator 1 is provided in the first unit E at the first point M1 which generates a signal which is sent via a transceiver unit 5 to the other point M2. The signal generator 1 is controlled by the phase measurement unit 4 disposed in the unit E. In this exemplary embodiment too the transceiver unit 5 is a DLC modem. A second unit Ex is disposed at the second point M2, which likewise has available to it a transceiver unit 5 embodied as a DLC modem. The transceiver units 5 are respectively connected at each point M1, M2 with the three phase conductors L1, L2, L3 as well as the neutral conductor N.

In FIG. 3 the comparison unit 2 takes over the assignment of the phase conductors in the unit or in each unit Ex, if there are number of such units. The assignment unit 3 provided at the first point M1 (and/or further assignment units at other points) receives the information about the assignment of the phase conductor connections from the comparison unit or comparison units 2 of the units Ex, therefore the transceiver units 5 are also connected to the assignment unit 3 here, which is likewise disposed in the first unit E. The first and the second point M1, M2 each have a phase measurement unit 4 in their units E, Ex, which is connected to the three phase conductors L1, L2, L3 and also to the neutral conductor N at the respective point. The second point M2 additionally has a comparison unit 2 connected to the phase measurement unit 4, with which or the phase conductors L1$x$, L2$x$, L3$x$ the time difference for the phase difference between reference time and time of zero crossing of the phase voltage can be determined. The comparison unit 2 is connected to the transceiver unit 5 so that the time or phase difference determined and the assignment of the phase conductors determined therefrom can be transferred to the assignment unit 3. In this exemplary embodiment too the three-phase network is also used as a communication medium between the units E, Ex.

The phase measurement unit 4 of the first unit E detects the zero crossings of the phase voltages UL1, UL2, UL3 and through this information controls the signal generator 1, which at periodic intervals transmits a data packet Txd via the modem (transceiver unit 5) into the three-phase network between the neutral conductor N and the first phase conductor L1 synchronous to the zero crossing of the falling edge of the phase voltage. The data packet TxD contains information about whether the data packet TxD has been transmitted synchronously with the zero crossing of the falling edge of the phase voltage UL1 and is measured via the phase relationship or the phase sequence of the phase voltages UL1, UL2, UL3 at the first point M1, i.e. those values which have been measured with the first unit E.

The data packet TxD could also be notified the signal generator 1 and the comparison units 2 via another transmission path or with a further data packet.

FIG. 4 shows a schematic diagram of the timing curve of the phase voltages of the phase conductors from FIG. 3. The first unit E, at the zero crossing of the falling edge of the phase voltage UL1, sends a data packet TxD to the second unit Ex. In the second unit Ex the data packet is received as RxDx via the modem (transceiver unit 5). Together with additional information about the respective propagation time of the data packet for propagation time correction, the data packet RxDx is transferred to the comparison unit 2. In the phase measurement unit 4 of the unit Ex the zero crossings of the phase voltages UL1$x$, UL2$x$, UL3$x$ are detected and transferred as phase information to the comparison unit 2 for comparison with the receive times of the data packets RxDx. The receive time, corrected if necessary by the propagation time of the data packet RxDx, represents the reference time.

On comparison in the comparison unit 2 of the unit Ex, time differences $\Delta tL1x$, $\Delta tL2x$, $\Delta tL3x$ between the receive time of the data packet RxDx on the one hand and the times of the zero crossings of the phase voltages UL1$x$, UL2$x$, UL3$x$ on the other hand are formed. These time differences are shown in the drawing in FIG. 4.

As a result of the information transferred in data packet RxDx, only the smallest time difference has to be determined in the comparison unit 2 since the phase conductor with the smallest time difference, which in the ideal case is zero, corresponds to the first phase conductor L1 at the first point M1, of which the time difference is likewise zero, since the data packet TxD would indeed be sent out at the zero crossing of the falling edge of UL1. In the present example the phase conductor L2$x$ in accordance with FIG. 4, at the second point M2, has an insignificantly small time difference $\Delta tL2x$, so that this results in the first phase conductor L1 at the first point M1 corresponding to the second phase conductor L2$x$ at the second point M2. As a result of the phase information of the phase voltages UL2 and UL3 at the first point M1, which were contained in data packets TxD or RxDx, the other phase conductors L1$x$, L3$x$ at the second point M2 can be assigned absolutely to the phase conductors of the first point M2: in the ideal case the same or almost the same phase difference (or time difference) on zero crossing of the falling edge of the phase voltage means the same phase conductor:

L1 corresponds to L2$x$,
L2 corresponds to L3$x$,
L3 corresponds to L1$x$.

This information is then transferred to the assignment units 3 of the first unit E via the DLC connection, i.e. the modems (transceiver units 5) and the phase conductors. In this exemplary embodiment too the information can be made available to other devices.

Naturally other options are also available in general for determining the common reference point, such as by pre-specifying a specific reference point, such as that the measurement is to be undertaken each hour on the hour or by a corresponding local time setting in the comparison units 2 which initiates the corresponding measurements by the phase measurement units 4.

The physical invention makes possible automatic detection of the phase conductor assignment in an electrical energy distribution network and does so without knowledge of its topology or, for a change in the topology, by switchovers in the energy distribution network or between a number of distribution networks or energy supply points.

The method is suitable both for three-wire also for four-wire systems as well as for combinations thereof.

To carry out the inventive method devices can be used which are present and are used in any event in a distribution network, such as devices for remote meter readout or for measuring the voltage quality.

LIST OF REFERENCE CHARACTERS

1 Signal generator
2 Comparison unit
3 Assignment unit
4 Phase measurement unit
5 Transceiver unit
E First unit
Er Third unit (reference unit)
Ex Second unit
L1, L2, L3 First, second, third phase conductor
M1, M2, M3 First, second, third point
N Neutral conductor
RxDr Data packet in the third unit Er
RxDx Data packet in the second unit Ex
TxD Data packet in the first unit E
UL1, UL2, UL3 Phase voltages at first unit E
UL1$r$, UL2$r$, UL3$r$ Phase voltages at third unit Er
UL1$x$, UL2$x$, UL3$x$ Phase voltages at second unit Ex
$\Delta tL1x$, $\Delta tL2x$, $\Delta tL3x$ Time differences at second unit Ex
$\Delta tL1r$, $\Delta tL2r$, $\Delta tL3r$ Time differences at third unit Er

The invention claimed is:

1. A method for assigning individual phase conductors at a first point to phase conductors at at least one further point in a polyphase energy distribution network, in a case of mains operation, which comprises the steps of:
    determining a common reference time for points in the polyphase energy distribution network including the first point and the at least one further point;
    determining for the first point, in a case of a four-conductor network, for at least one phase conductor a time difference and/or a phase difference of a phase voltage between a reference time and a time of a zero crossing of the phase voltage, or determining in a case of a three-conductor network, for at least two of the phase conductors the time difference and/or the phase difference of a line-to-line voltage between the reference time and the time of the zero crossing of the line-to-line voltage;

determining for the further point, in the case of the four-conductor network, for at least one phase conductor, the time difference and/or the phase difference of the phase voltage between the reference time and the time of the zero crossing of the phase voltage, or determining in the case of the three-conductor network, for the least two phase conductors, the time difference and/or the phase difference of line-to-line voltages between the reference time and the time of the zero crossing of the line-to-line voltages;

comparing the time difference and/or the phase difference at the first point with the time difference and/or the phase difference at the further point; and assigning a phase conductor of the first point to a phase conductor of the further point having a same time difference and/or a same phase difference in relation to the common reference time.

2. The method according to claim 1, wherein for determining the time difference and/or the phase difference at the first and further points, determining phase voltages or the line-to-line voltages of all three phase conductors at the reference time.

3. The method according to claim 1, which further comprises selecting the common reference time so that time coincides with the time of the zero crossing of the phase voltage or the line-to-line voltage at the first point.

4. The method according to claim 1, which further comprises defining the common reference time by transmitting a signal to the points.

5. The method according to claim 4, wherein the signal contains information which defines the reference time for a time after a receipt of the signal.

6. The method according to claim 4, which further comprises transmitting the signal via at least one conductor of the polyphase energy distribution network.

7. The method according to claim 4, which further comprises transmitting the signal from one point in the polyphase energy distribution network.

8. The method according to claim 4, wherein the signal contains information about time differences or phase differences of the phase voltages or the line-to-line voltages respectively at one point.

9. The method according to claim 4, wherein the polyphase energy distribution network is a three-phase network.

10. The method according to claim 8, wherein the one point is the first point.

11. A device for carrying out a method for assigning individual phase conductors at a first point to phase conductors at at least one further point in a polyphase energy distribution network, the device comprising:

a signal generator for defining a common reference time;

a phase measurer disposed at at least two points, with said phase measurer a time of a zero crossing of a phase voltage on at least one phase conductor or a line-to-line voltage of at least two phase conductors can be measured;

a comparison unit connected to at least one said phase measurer at the points, wherein a time difference or a phase difference between a reference time and the time of the zero crossing can be determined with said phase measurer; and at least one assignment unit connected with said comparison unit, by comparing time differences or phase differences at two different points, the phase conductor of the first point can be assigned to the phase conductor of a second point which has a same time difference or a same phase difference.

12. The device according to claim 11, wherein:

said signal generator for defining the common reference time at the time of zero crossing of the phase voltage or of the line-to-line voltage is disposed at a first point;

said phase measurer is disposed at the first point or at at least one further point, with which the time of the zero crossing of the phase voltage on at least one phase conductor or the line-to-line voltage of at least two phase conductors can be measured;

said comparison unit connected to said phase measurer at the second point, wherein with said phase measurer the time difference or the phase difference between the reference time and the time of the zero crossing can be defined, and with said comparison unit that phase conductor of the first point can be assigned to the phase conductor of the second point; and said assignment unit, with which information about an assignment can be collected and further distributed, is disposed at the first point.

13. The device according to claim 11, further comprising transceiver units, at least one of said transceiver unit disposed at each of the points connected for transmission of signals, to said phase measurer, said signal generator, said comparison unit and said assignment unit.

14. The device according to claim 13, wherein said transceiver unit is connected at each of the points to the phase conductors and a neutral conductor for transmission of signals over the energy distribution network.

15. The device according to claim 14, wherein said transceiver unit is embodied at each point for transmission of signals by means of conductors which do not belong to the polyphase energy distribution network, by means of radio or by means of optical data transmission.

16. The device according to claim 13, wherein said transceiver units transmit data packets to said phase measurer, said signal generator, said comparison unit and said assignment unit.

17. The device according to claim 14, wherein said transceiver unit transmits data packets over the polyphase energy distribution network.

\* \* \* \* \*